United States Patent
Park et al.

(10) Patent No.: US 10,476,479 B2
(45) Date of Patent: Nov. 12, 2019

(54) FILTER AND FILTER MODULE

(71) Applicant: Samsung Electro-Mechanics Co., Ltd., Suwon-si (KR)

(72) Inventors: Yoon Sok Park, Suwon-si (KR); June Kyoo Lee, Suwon-si (KR); Won Kyu Jeung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 91 days.

(21) Appl. No.: 15/800,987

(22) Filed: Nov. 1, 2017

(65) Prior Publication Data

US 2018/0294796 A1     Oct. 11, 2018

(30) Foreign Application Priority Data

Apr. 10, 2017    (KR) .................. 10-2017-0046264

(51) Int. Cl.
| | |
|---|---|
| *H03H 9/54* | (2006.01) |
| *H03H 9/64* | (2006.01) |
| *H03H 9/02* | (2006.01) |
| *H03H 9/17* | (2006.01) |
| *H03H 9/00* | (2006.01) |
| *H03H 9/70* | (2006.01) |
| *H03H 9/58* | (2006.01) |
| *H03H 9/60* | (2006.01) |
| *H03H 9/05* | (2006.01) |

(52) U.S. Cl.
CPC ........ *H03H 9/542* (2013.01); *H03H 9/0095* (2013.01); *H03H 9/02086* (2013.01); *H03H 9/0514* (2013.01); *H03H 9/173* (2013.01); *H03H 9/584* (2013.01); *H03H 9/587* (2013.01); *H03H 9/60* (2013.01); *H03H 9/605* (2013.01); *H03H 9/6489* (2013.01); *H03H 9/703* (2013.01)

(58) Field of Classification Search
CPC ............ H03H 9/02086; H03H 9/0095; H03H 9/0514; H03H 9/0523; H03H 9/0547; H03H 9/173; H03H 9/542; H03H 9/584; H03H 9/587; H03H 9/60; H03H 9/605; H03H 9/6489; H03H 9/703; H03H 2009/02204
USPC .................. 333/133, 189, 193–195
See application file for complete search history.

(56) References Cited

U.S. PATENT DOCUMENTS

| | | | | |
|---|---|---|---|---|
| 5,786,738 A | * | 7/1998 | Ikata | H03H 9/0576 333/133 |
| 6,653,913 B2 | * | 11/2003 | Klee | H03H 3/04 333/188 |

(Continued)

FOREIGN PATENT DOCUMENTS

| | | |
|---|---|---|
| JP | 2009-130831 A | 6/2009 |
| KR | 10-2012-0061466 A | 6/2012 |

(Continued)

OTHER PUBLICATIONS

Korean Office Action dated Mar. 13, 2018, in corresponding Korean Application No. 10-2017-0046264 (5 pages in English, 4 pages in Korean).

*Primary Examiner* — Barbara Summons
(74) *Attorney, Agent, or Firm* — NSIP Law

(57) ABSTRACT

A filter includes: series resonators connected to each other in series; shunt resonators connected to first nodes between some of the series resonators; and a variable capacitor connected to a second node between some of the series resonators, and forming a pole configured to suppress harmonics.

15 Claims, 4 Drawing Sheets

(56) References Cited

U.S. PATENT DOCUMENTS

| | | | | |
|---|---|---|---|---|
| 6,927,649 | B2* | 8/2005 | Metzger | H03H 9/0557 |
| | | | | 333/133 |
| 7,030,718 | B1* | 4/2006 | Scherer | H03J 3/20 |
| | | | | 331/117 R |
| 7,579,927 | B2* | 8/2009 | Iwamoto | H03H 9/0571 |
| | | | | 333/133 |
| 7,884,686 | B2* | 2/2011 | Pitschi | H03H 9/0557 |
| | | | | 333/133 |
| 8,269,577 | B2* | 9/2012 | Inoue | H03H 9/547 |
| | | | | 333/133 |
| 9,571,061 | B2* | 2/2017 | Shealy | H03H 9/205 |
| 2003/0227358 | A1* | 12/2003 | Inose | H03H 9/6423 |
| | | | | 333/193 |
| 2008/0081398 | A1 | 4/2008 | Lee et al. | |
| 2011/0109400 | A1* | 5/2011 | Koga | H03H 9/0576 |
| | | | | 333/4 |
| 2012/0139664 | A1 | 6/2012 | Kim et al. | |
| 2014/0184356 | A1 | 7/2014 | Kihara et al. | |
| 2016/0028366 | A1* | 1/2016 | Takamine | H03H 9/0576 |
| | | | | 333/133 |
| 2017/0163242 | A1* | 6/2017 | Miyamoto | H03H 9/542 |

FOREIGN PATENT DOCUMENTS

| | | |
|---|---|---|
| KR | 10-2014-0085335 A | 7/2014 |
| WO | WO 00/45459 A1 | 5/2002 |

\* cited by examiner

FILTER AND FILTER MODULE

CROSS-REFERENCE TO RELATED APPLICATIONS

This application claims the benefit under 35 U.S.C. § 119(a) of Korean Patent Application No. 10-2017-0046264 filed on Apr. 10, 2017 in the Korean Intellectual Property Office, the entire disclosure of which is incorporated herein by reference for all purposes.

BACKGROUND

1. Field

The following description relates to a filter and a filter module.

2. Description of Related Art

In accordance with recently rapid development of mobile communication devices, and chemical and biological devices, demand for compact lightweight filters, oscillators, resonant elements, and acoustic resonant mass sensors used in such devices is also increasing.

A film bulk acoustic resonator (FBAR) is known as a unit for realizing such a compact lightweight filter, an oscillator, a resonant element, and an acoustic resonance mass sensor. There are advantages, in that the FBAR may be mass-produced at a minimal cost and may be implemented to have a very small size. Also, there are advantages in that it is possible to implement a high quality factor (Q) value, which is a major characteristic of a filter. Therefore, the FBAR may be used in a microwave frequency band, and, in particular, a PCS (Personal Communications System) band and a DCS (Digital Cordless System) band.

In general, an FBAR has a structure including a resonator formed by sequentially stacking a first electrode, a piezoelectric layer, and a second electrode on a substrate. In operation of the FBAR, an electric field is induced in the piezoelectric layer by electrical energy applied to the first and second electrodes, a piezoelectric phenomenon occurs in the piezoelectric layer by the induced electric field, and thus the resonator vibrates in a predetermined direction. As a result, bulk acoustic waves are generated in the same direction as a vibration direction, causing resonance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a filter includes: series resonators connected to each other in series; shunt resonators connected to first nodes between some of the series resonators; and a variable capacitor connected to a second node between some of the series resonators, and forming a pole configured to suppress harmonics.

A frequency of the pole may be determined by a capacitance of the variable capacitor.

The frequency of the pole may be lowered as the capacitance of the variable capacitor increases.

The variable capacitor may be formed by a wiring electrode corresponding to the second node and a dummy connection pad provided below the wiring electrode.

A substrate may be disposed between the wiring electrode and the dummy connection pad.

The dummy connection pad may be connected to a main substrate disposed below the substrate.

The dummy connection pad may include a plurality of dummy connection pads. At least one dummy connection pad among the plurality of dummy electrode pads may be provided with a ground potential from the main substrate and at least one other dummy connection pad among the plurality of dummy connection pads may be floating.

The capacitance of the variable capacitor may be determined by a number of the at least one dummy connection pad connected to the ground potential.

The number of the at least one dummy connection pad connected to the ground potential may be determined according to a frequency of harmonics.

In another general aspect, a filter module includes: a filter including bulk acoustic resonators each formed by a substrate, and a first electrode, a piezoelectric layer, and a second electrode that are sequentially stacked on the substrate, and at least one dummy connection pad disposed below the substrate; and a main substrate connected to a connection pad connected to either one or both of the first electrode and the second electrode via a bump.

The main substrate may provide a ground potential to some of the at least one dummy connection pad.

The at least one dummy connection pad may be disposed below a wiring electrode connecting adjacent bulk acoustic resonators among the bulk acoustic resonators.

The wiring electrode and the at least one dummy connection pad may form a mutual capacitance.

The substrate may be configured to function as a dielectric.

The mutual capacitance may form a pole configured to suppress harmonics.

A frequency of the pole may be determined by the mutual capacitance.

The wiring electrode may correspond to a node between the adjacent bulk acoustic resonators, and the adjacent bulk acoustic resonators may be connected in series.

In another general aspect, a filter includes: a first series resonator and a second series resonator connected to each other in series; a shunt resonator connected to a first node between the first series resonator and the second series resonator; and a variable capacitor connected to a second node between the first series resonator and the second series resonator, and configured to suppress harmonics.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
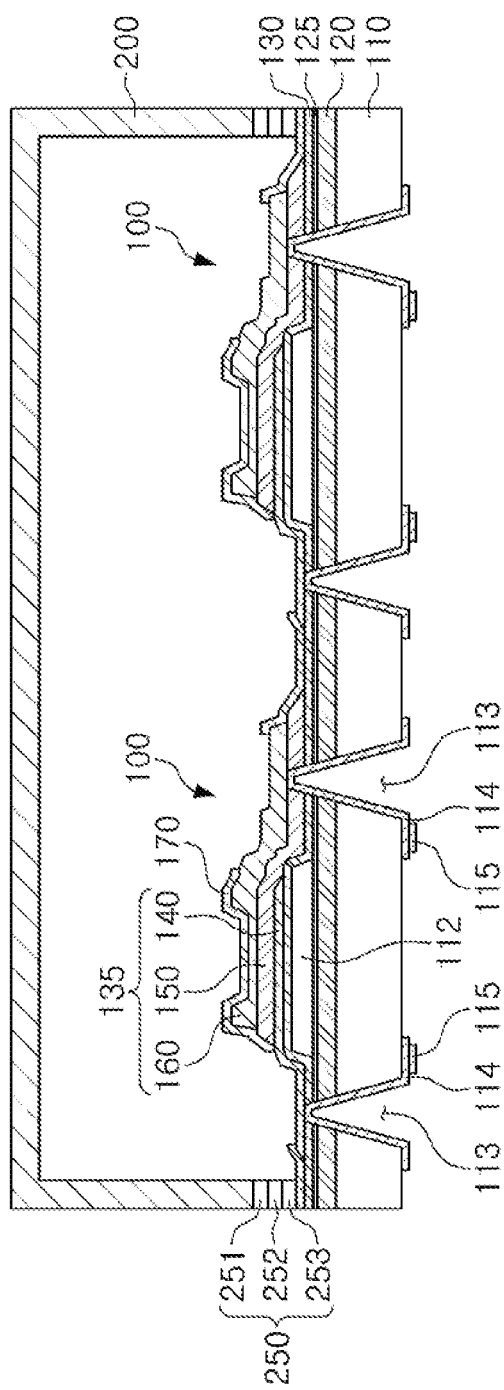
FIG. 1 is a cross-sectional view of a filter, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," "coupled to," "over," or "covering" another element, it may be directly "on," "connected to," "coupled to," "over," or "covering" the other element, or there may be one or more other elements intervening therebetween. In contrast, when an element is described as being "directly on," "directly connected to," "directly coupled to," "directly over," or "directly covering" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, embodiments will be described in detail with reference to the accompanying drawings.

FIG. 1 is a cross-sectional view of a filter 10, according to an embodiment.

Referring to FIG. 1, the filter 10 includes bulk acoustic resonators 100 and a cap 200. The bulk acoustic resonators 100 are, for example, film bulk acoustic resonators (FBAR).

The bulk acoustic resonators 100 are implemented by a stack structure composed of a plurality of films. Although FIG. 1 shows two bulk acoustic resonators 100 implemented by the stack structure, the filter 10 may include three or more bulk acoustic resonators 100 implemented by the stack structure according to design objectives, and adjacent bulk acoustic resonators 100 may be electrically connected to each other by wiring electrodes. As an example, the wiring electrodes connect first electrodes 140 of the adjacent bulk acoustic resonators 100 to each other and connect second electrodes 160 of the adjacent bulk acoustic resonators 100 to each other.

The bulk acoustic resonator 100 includes a substrate 110, an insulating layer 120, an air cavity 112, and a resonator 135.

The substrate 110 may be a silicon substrate. The insulating layer 120 is formed on an upper surface of the substrate 110 to electrically isolate the resonator 135 from the substrate 110. The insulating layer 120 may be formed on the substrate 110 by using one of silicon dioxide ($SiO_2$) and aluminum oxide ($Al_2O_3$) by chemical vapor deposition, RF magnetron sputtering, or evaporation.

The air cavity 112 is disposed on the insulating layer 120. The air cavity 112 is positioned below the resonator 135 so that the resonator 135 vibrates in a predetermined direction. The air cavity 112 may be formed by forming a sacrificial layer pattern on the insulating layer 120, forming a membrane 130 on the sacrificial layer pattern, and then etching and removing the sacrificial layer pattern. The membrane 130 may be an oxide protection layer or a protective layer for protecting the substrate 110.

An etch stop layer 125 is additionally formed between the insulating layer 120 and the air cavity 112. The etch stop layer 125 protects the substrate 110 and the insulating layer 120 from an etching process and is a base for depositing other layers on the etch stop layer 125.

The resonator 135 includes the first electrode 140, a piezoelectric layer 150, and a second electrode 160 that are sequentially stacked on the membrane 130. A common region of the first electrode 140, the piezoelectric layer 150, and the second electrode 160 overlapping in a vertical direction is located above the air cavity 112. The first electrode 140 and the second electrode 160 may be formed of any one of gold (Au), titanium (Ti), tantalum (Ta), molybdenum (Mo), ruthenium (Ru), platinum (Pt), tungsten and alloys thereof.

The piezoelectric layer 150 generates a piezoelectric effect to convert electrical energy into mechanical energy in an elastic wave form and may be formed of any one of aluminum nitride (AlN), zinc oxide (ZnO), and lead zirconium titanium oxide (PZT; PbZrTiO). Also, the piezoelectric layer 150 may further include a rare earth metal. As an example, the rare earth metal includes any one or any combination of any two or more of scandium (Sc), erbium (Er), yttrium (Y), and lanthanum (La). The piezoelectric layer 150 may include a rare earth metal of 1 to 20 atomic %.

A seed layer for improving a crystal orientation of the piezoelectric layer 150 may be additionally disposed below the first electrode 140. The seed layer may be formed of any one of aluminum nitride (AlN), zinc oxide (ZnO), and lead zirconium titanium oxide (PZT; PbZrTiO) having the same crystallinity as the piezoelectric layer 150.

The resonator 135 includes an active region and an inactive region. The active region of the resonator 135 is a region that vibrates and resonates in a predetermined direction due to the piezoelectric effect generated in the piezoelectric layer 150 when electric energy such as a radio frequency signal is applied to the first electrode 140 and the second electrode 160, and is a region in which the first electrode 140, the piezoelectric layer 150, and the second electrode 160 overlap in the vertical direction above the air cavity 112. The inactive region of the resonator 135 is a region that does not resonate due to the piezoelectric effect even when electrical energy is applied to the first electrode 140 and the second electrode 160, and is a region outside the active region.

The resonator 135 outputs a radio frequency signal having a specific frequency by using the piezoelectric phenomenon. Specifically, the resonator 135 outputs a radio frequency signal having a resonance frequency corresponding to vibration according to the piezoelectric phenomenon of the piezoelectric layer 150.

A protection layer 170 is disposed on the second electrode 160 of the resonator 135 to prevent the second electrode 160 from being exposed to the outside. The protection layer 170 may be formed of any one of a silicon oxide based insulating material, a silicon nitride based insulating material, and an aluminum nitride based insulating material.

At least one via hole 113 is formed in a lower surface of the substrate 110 to penetrate the substrate 110 in a thickness direction. The via hole 113 penetrates some of the insulating layer 120, the etch stop layer 125, and the membrane 130 in the thickness direction in addition to the substrate 110. A connection pattern 114 is formed in the via hole 113 and is formed on an inner surface of the via hole 113. For example, the connection pattern 114 is formed on an entire inner wall of the via hole 113.

The connection pattern 114 may be manufactured by forming a conductive layer on the inner surface of the via hole 113. For example, the connection pattern 114 is formed by depositing or applying or charging a conductive metal including any one of gold (Au), copper (Cu), and titanium (Ti)-copper (Cu) alloy along the inner wall of the via hole 113.

The connection pattern 114 is connected to either one or both of the first electrode 140 and the second electrode 160. For example, the connection pattern 114 penetrates at least some of the substrate 110, the membrane 130, the first electrode 140, and the piezoelectric layer 150 and is electrically connected to either one or both of the first electrode 140 and the second electrode 160. The connection pattern 114 formed on the inner surface of the via hole 113 extends to the lower surface of the substrate 110 and is connected to a connection pad 115 provided on the lower surface of the substrate 110. Thus, the connection pattern 114 electrically connects the first electrode 140 and the second electrode 160 to the connection pad 115. As an example, the connection pad 115 includes copper (Cu).

Figure 5:
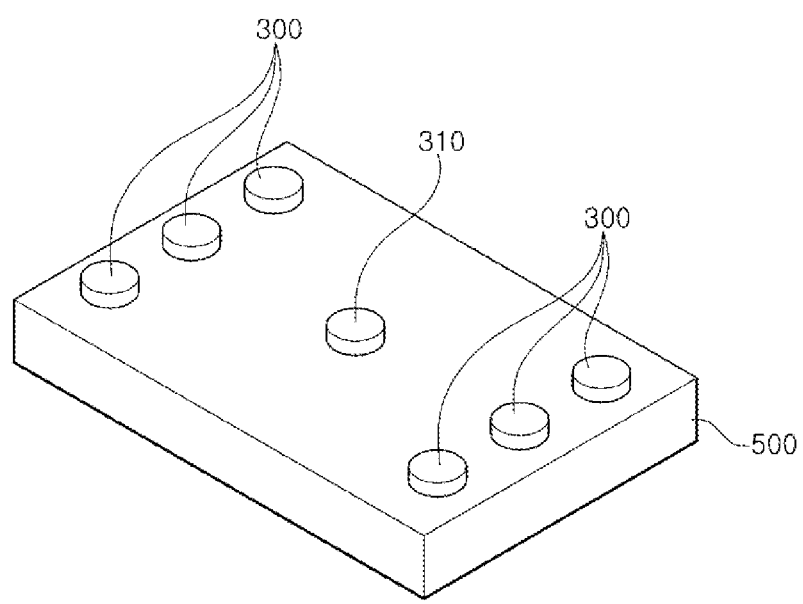
FIG. 5 is a top view of a main substrate for a filter module according to an embodiment.

As shown in FIG. 5, the connection pad 115 may be electrically connected to a main substrate 500, which may be disposed below the filter 10, through a bump 300. The bulk acoustic resonator 100 performs a filtering operation of a radio frequency signal by a signal applied to the first and second electrodes 110 and 120 from the main substrate 500 through the connection pad 115. The filter 10, when connected to the main substrate 500, forms a filter module.

The cap 200 is bonded to the stack structure forming the bulk acoustic resonators 100, thereby protecting the bulk acoustic resonators 100 from an external environment. The cap 200 is formed in a cover shape having an inner space in which the bulk acoustic resonators 100 are accommodated. The cap 200 is formed, for example, in a hexahedron shape having an open lower surface, and thus includes an upper surface and side surfaces.

For example, an accommodator is formed in a center of the cap 200 to accommodate the resonant part 135 of the bulk acoustic resonator 100 and a rim is formed to have a step relative to the accommodator so as to be bonded to a bonding region of the stack structure. The bonding region of the stack structure may correspond to an edge of the stack structure.

Although FIG. 1 shows the cap 200 bonded to the protection layer 170 deposited on the substrate 110, the cap 200 may additionally be bonded to any one or any combination of any two or more of the membrane 130, the etch stop layer 125, the insulating layer 120, and the substrate 110.

The cap 200 may be bonded to the stack structure by eutectic bonding. In such an example, after a bonding agent 250 capable of eutectic bonding is deposited on the stack structure, the stack structure and the cap 200 is bonded together by pressing and heating.

The bonding agent 250 is composed of at least one bonding layer to eutectically bond the stack structure and the cap 200. The bonding agent 250 is provided in a bonding region of the stack structure and the cap 200.

The bonding agent 250 may include at least three bonding layers sequentially stacked between the stack structure and the cap 200. For example, the bonding agent 250 includes a first bonding layer 251, a second bonding layer 252, and a third bonding layer 253. The first bonding layer 251 may include any one of gold (Au), copper (Cu), silver (Ag), platinum (Pt), nickel (Ni), and palladium (Pd). The second bonding layer 252 may include tin (Sn). The third bonding layer 253 may include any one of gold (Au), copper (Cu), silver (Ag), platinum (Pt), nickel (Ni), and palladium (Pd). The first bonding layer 251 and the third bonding layer 253 may be formed of the same material to enable eutectic bonding together with the second bonding layer 252.

Figure 2A:
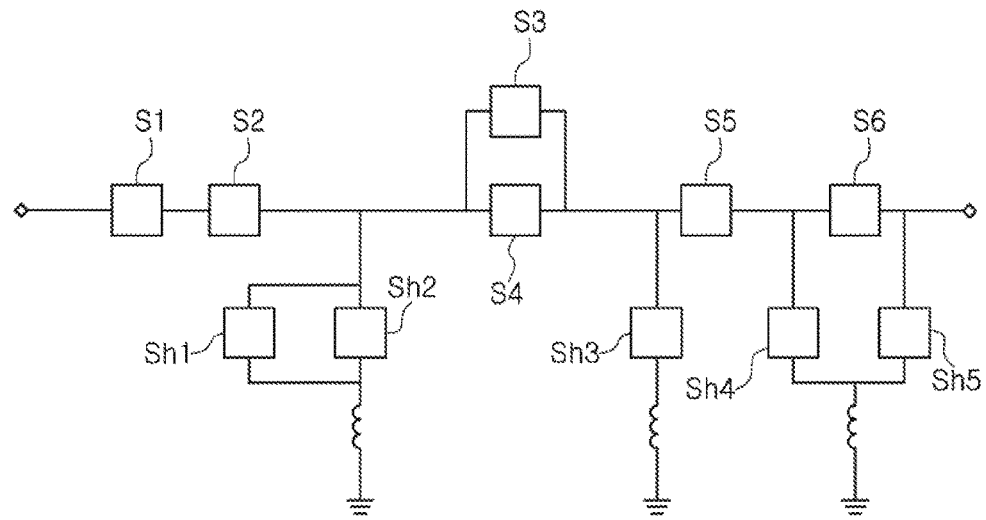
FIGS. 2A and 2B are circuit diagrams of a filter according to a comparative example and an embodiment, respectively.
Figure 2B:
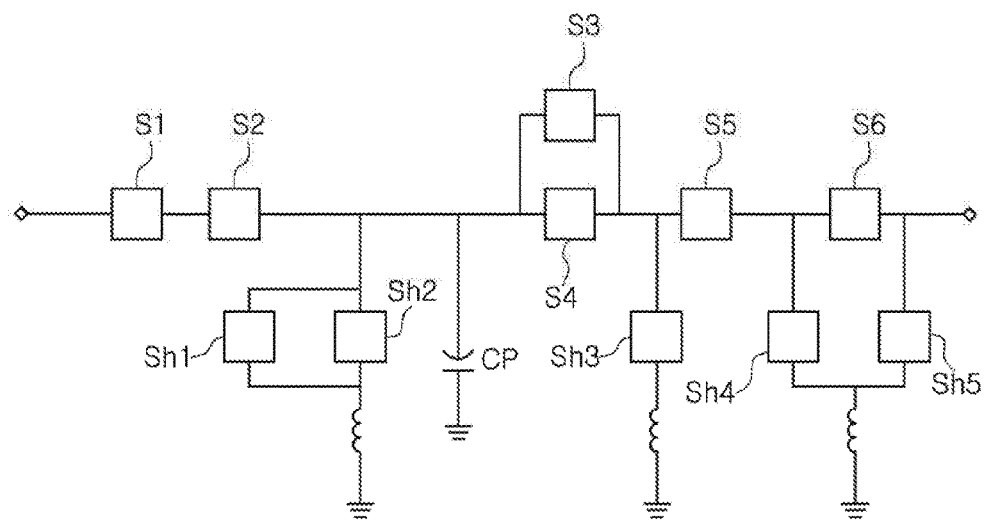

FIG. 2A is a circuit diagram of a filter according to a comparative example. FIG. 2B is a circuit diagram of a filter, such as the filter 10 of FIG. 1, according to an embodiment.

Referring to FIG. 2A, the filter of the comparative example includes first through sixth series resonators S1-S6 and first through fifth shunt resonators Sh1-Sh5.

The series resonators S1-S6 are connected in series with each other. Specifically, some of the series resonators S1-S6 are connected in series with each other, and the others are connected in parallel with each other and connected in series with the some of the series resonators S1-S6 that are connected in series with each other. For example, in FIG. 2A, the first series resonator S1, the second series resonator S2, the third series resonator S3 and the fourth series resonator S4 that are connected in parallel with each other, the fifth series resonator S5, and the sixth series resonator S6 are connected in series.

The shunt resonators Sh1-Sh5 are disposed between nodes between some (e.g., two or more adjacent series resonators) of the series resonators S1-S6 and ground. Specifically, some of the shunt resonators Sh1-Sh5 are disposed between nodes between some (e.g., two or more adjacent series resonators) of the series resonators S1-S6 and ground, and others of the shunt resistors Sh1-Sh5 are connected in parallel with each other and are disposed between some nodes between some (e.g., two or more adjacent series resonators) of the series resonators S1-S6 and ground. For example, in FIG. 2A, the first shunt resonator Sh1 and the second shunt resonator Sh2 are connected in parallel to each other and are disposed between the ground and a node between the second series resonator S2 and the third series resonator S3 and the fourth series resonator S4, which are connected to each other in parallel. Also, the third shunt resonator Sh3 is disposed between the ground and a node between the third series resonator S3 and the fourth series resonator S4, which are connected to each other in parallel, and the fifth series resonator S5. The fifth shunt resonator Sh5 is disposed between the sixth series resonator S6 and ground. According to an embodiment, the shunt resonators Sh1-Sh5 are connected to ground via a trimming inductor.

The filter shown in FIG. 2A forms a pass band by a resonance frequency of a series resonator and an anti-resonance frequency of a shunt resonator and forms a skirt by an anti-resonance frequency of the series resonator and a resonance frequency of the shunt resonator. However, in addition to the intended pass band, harmonics are generated at an integral multiple of a desired frequency due to mutual modulation distortion, and unnecessary resonance generated by the harmonics acts as noise to the filter. Therefore, it is desirable to block the harmonics.

Referring to FIG. 2B, the circuit diagram of the filter of FIG. 2B is similar to the circuit diagram of the filter of FIG. 2A in several aspects. Therefore, in the following description of FIG. 2B, a description of features that are the same as or redundant with respect to those of FIG. 2A will be omitted, and only features that differ from those described in FIG. 2 will be described.

Referring to FIG. 2B, the filter includes first through sixth series resonators S1-S6 and first through fifth shunt resonators Sh1-Sh5. The series resonators S1-S6 and the shunt resonators Sh1-Sh5 each correspond to a bulk acoustic resonator 100 implemented by the above-described stack structure.

The filter further includes a variable capacitor CP, unlike the filter of the comparative example of FIG. 2A. The variable capacitor CP is disposed between a node between some (e.g., two or more adjacent series resonators) of the series resonators S1-S6 and the ground. As an example, the variable capacitor CP is disposed between the ground and a node between the second series resonator S2 and the third series resonator S3 and the fourth series resonator S4, which are connected to each other in parallel.

The variable capacitor CP forms a pole configured to suppress harmonics. For example, the pole formed by the variable capacitor CP suppresses second harmonics of a desired frequency.

Figure 3:
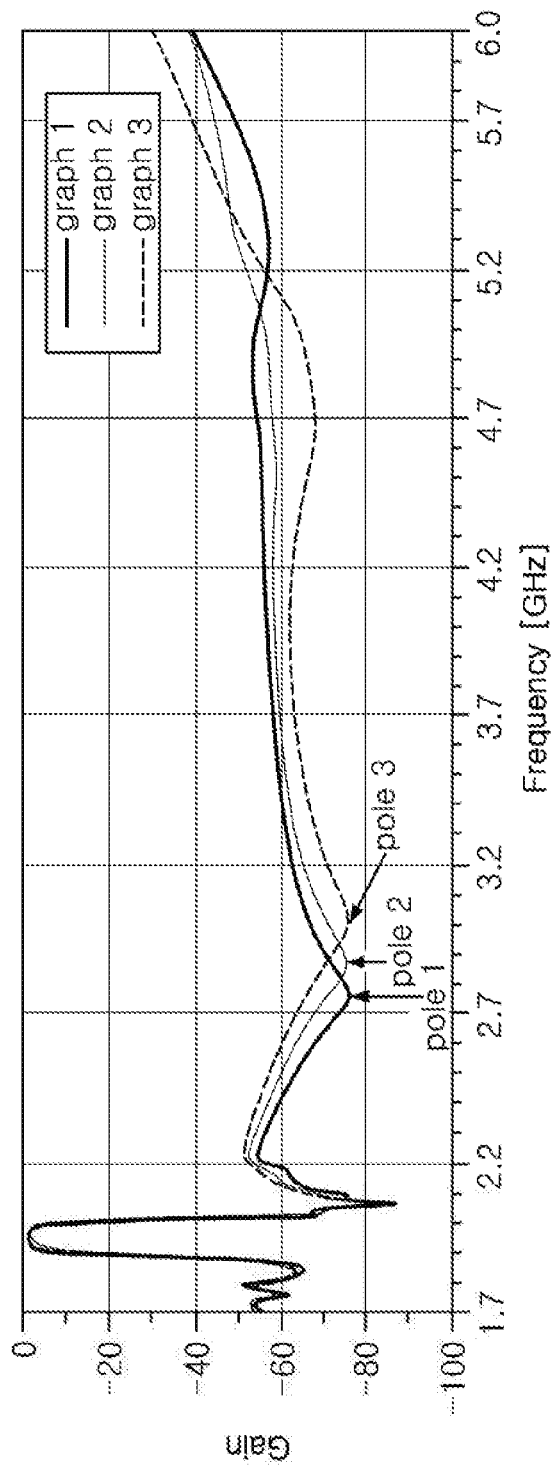
FIG. 3 is a simulation graph of a filter according to an embodiment.

FIG. 3 is a simulation graph of a filter, according to an embodiment.

A first graph (graph 1) and a second graph (graph 2) in the simulation graph of FIG. 3 correspond to an embodiment of this disclosure, and a third graph (graph 3) corresponds to a comparative example. Specifically, the first graph (graph 1) in the simulation graph of FIG. 3 shows that capacitance of a variable capacitor is 1 [pF], the second graph (graph 2) shows that the capacitance of the variable capacitor is 0.5 [pF], and the third graph (graph 3) shows that the capacitance of the variable capacitor is 0 [pF].

Upon comparing the first graph (graph 1), the second graph (graph 2) and the third graph (graph 3), it can be seen that as the capacitance of the variable capacitor CP increases, a frequency of the pole decreases by about 0.1 [Hz].

The filter according to an embodiment of this disclosure adjusts a frequency of a pole for suppressing harmonics by varying a capacitance of a variable capacitor (e.g., the variable capacitor CP in FIG. 2B). Hereinafter, a method of forming a variable capacitor and a method of varying a capacitance of the variable capacitor in the filter, according to an embodiment, will be described in detail.

Figure 4:
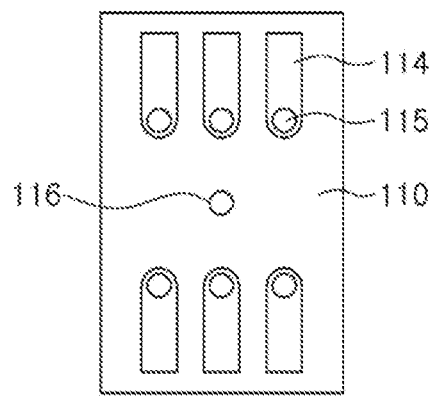
FIG. 4 is a bottom view of a filter, according to an embodiment.

FIG. 4 is a bottom view of the filter 10 of FIG. 1, according to an embodiment.

Referring to FIGS. 1 and 4, the filter 10 includes a dummy connection pad 116 in addition to the connection pad 115 that is connected to the connection pattern 114. While the connection pad 115 is connected to the connection pattern 114, which is formed on the inner surface of the via hole 113, the dummy connection pad 116 is directly disposed on the substrate 110 without being connected to the connection pattern 114. In this regard, the dummy connection pad 116 is disposed below a wiring electrode interconnecting the adjacent bulk acoustic resonators 100 in the filter 10, and the wiring electrode corresponds to a node between series resonators of FIG. 2B.

Although one dummy connection pad 116 is shown in FIG. 4, multiple dummy connection pads 116 may be provided. Each of the dummy connection pads 116 may be electrically connected to the main substrate 500, which may be disposed below the filter 10, via a bump 310, as shown in FIG. 5.

Some of the dummy connection pads 116 may be provided with a ground potential from the main substrate 500, and the others of the dummy connection pads 116 may be floating. A dummy connection pad 116 connected to the ground potential of the main substrate 500 forms mutual capacitance with the wiring electrode, and in this case, the substrate 110 functions as a dielectric. That is, a variable capacitor CP shown in FIG. 2B may be formed by the mutual capacitance generated between the wiring electrode and the dummy connection pad 116 connected to the ground potential of the main substrate 500. However, since a signal is not applied to a floating dummy connection pad, the variable capacitor may not be formed by the floating dummy connection pad.

Therefore, magnitude of the capacitance of the variable capacitor CP is determined according to the number of the dummy connection pads 116 connected to the ground potential of the main substrate 500. In this regard, the magnitude of the capacitance of the variable capacitor CP can be selected to suppress harmonics through simulation.

The filter disclosed herein may adjust a frequency of a pole for suppressing harmonics by adjusting the number of the dummy connection pads 116 connected to the ground potential of the main substrate 500. Therefore, noise unnecessarily generated in the filter may be suppressed in an easy manner.

As set forth above, the filter and the filter module disclosed herein may suppress noise generated by harmonics and improve filtering characteristics.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A filter, comprising:
   series resonators connected to each other in series;
   shunt resonators connected to first nodes between some of the series resonators; and
   a variable capacitor connected to a second node between some of the series resonators
   wherein the variable capacitor is formed by a wiring electrode corresponding to the second node, a dummy connection pad disposed below the wiring electrode, and a substrate disposed between the wiring electrode and the dummy connection pad.

2. The filter of claim 1, wherein the variable capacitor forms a pole configured to suppress harmonics, and a frequency of the pole is determined by a capacitance of the variable capacitor.

3. The filter of claim 2, wherein the variable capacitor forms a pole configured to suppress harmonics, and the frequency of the pole is lowered as the capacitance of the variable capacitor increases.

4. The filter of claim 1, wherein the dummy connection pad is connected to a main substrate disposed below the substrate.

5. The filter of claim 4, wherein
   the dummy connection pad comprises a plurality of dummy connection pads,
   at least one dummy connection pad among the plurality of dummy connection pads is provided with a ground potential from the main substrate, and
   at least one other dummy connection pad among the plurality of dummy connection pads is floating.

6. The filter of claim 5, wherein the capacitance of the variable capacitor is determined by a number of the at least one dummy connection pad connected to the ground potential.

7. The filter of claim 6, wherein the number of the at least one dummy connection pad connected to the ground potential is determined according to a frequency of harmonics.

8. A filter module, comprising:
   a filter comprising
      bulk acoustic resonators each formed by a substrate, and a first electrode, a piezoelectric layer, and a second electrode that are sequentially stacked on the substrate, and
      at least one dummy connection pad disposed below the substrate; and
   a main substrate connected to a connection pad connected to either one or both of the first electrode and the second electrode via a bump,
   wherein the at least one dummy connection pad is disposed below a wiring electrode connecting adjacent bulk acoustic resonators among the bulk acoustic resonators.

9. The filter module of claim 8, wherein the main substrate provides a ground potential to some of the at least one dummy connection pad.

10. The filter module of claim 8, wherein the wiring electrode and the at least one dummy connection pad form a mutual capacitance.

11. The filter module of claim 10, wherein the substrate is configured to function as a dielectric.

12. The filter module of claim 10, wherein the mutual capacitance forms a pole configured to suppress harmonics.

13. The filter module of claim 12, wherein a frequency of the pole is determined by the mutual capacitance.

14. The filter module of claim 8, wherein the wiring electrode corresponds to a node between the adjacent bulk acoustic resonators, and the adjacent bulk acoustic resonators are connected in series.

15. A filter, comprising:
   a first series resonator and a second series resonator connected to each other in series;
   a shunt resonator connected to a first node between the first series resonator and the second series resonator; and
   a variable capacitor connected to a second node between the first series resonator and the second series resonator,
   wherein the variable capacitor is formed by a wiring electrode interconnecting the first series resonator and the second series resonator, a dummy connection pad disposed below the wiring electrode, and a substrate disposed between the wiring electrode and the dummy connection pad.

* * * * *